US008841966B2

(12) United States Patent
Lee et al.

(10) Patent No.: US 8,841,966 B2
(45) Date of Patent: Sep. 23, 2014

(54) SOUND OUTPUT DEVICE USING VACUUM TUBE, AUDIO APPARATUS AND METHOD FOR SOUND OUTPUT THEREOF

(75) Inventors: Jae-cheol Lee, Yongin-si (KR); Byung-soo Kim, Seoul (KR); Joo-moon Youn, Seoul (KR); Kee-yeong Cho, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 39 days.

(21) Appl. No.: 13/553,984

(22) Filed: Jul. 20, 2012

(65) Prior Publication Data

US 2013/0027131 A1    Jan. 31, 2013

(30) Foreign Application Priority Data

Jul. 26, 2011    (KR) .................... 10-2011-0074124
Aug. 9, 2011    (KR) .................... 10-2011-0078958
Apr. 16, 2012    (KR) .................... 10-2012-0039037

(51) Int. Cl.
*H03F 1/14* (2006.01)
*H03F 3/20* (2006.01)
*H03F 3/181* (2006.01)
*H03F 5/00* (2006.01)

(52) U.S. Cl.
CPC ............ *H03F 3/181* (2013.01); *H03F 3/20* (2013.01); *H03F 2200/03* (2013.01); *H03F 2200/321* (2013.01); *H03F 5/00* (2013.01)
USPC ........................................ 330/51; 330/124 D (58) Field of Classification Search
USPC ........... 330/3, 51, 151, 207 P, 124 D; 381/120
See application file for complete search history.

(56) References Cited

U.S. PATENT DOCUMENTS

| 2,946,014 | A | * | 7/1960 | Byles | ............................. 330/3 |
| 3,051,788 | A | * | 8/1962 | Seeley | ......................... 381/120 |
| 3,995,226 | A | * | 11/1976 | Berning | ........................... 330/3 |
| 5,705,950 | A | | 1/1998 | Butler | |
| 7,173,488 | B2 | * | 2/2007 | Smith | ........................... 330/119 |

FOREIGN PATENT DOCUMENTS

| AU | 27888/77 A | 2/1979 |
| DE | 2736575 A1 | 12/1978 |

OTHER PUBLICATIONS

Communication, dated Oct. 30, 2012, issued by the European Patent Office in counterpart European Patent Application No. 12174126.8.

* cited by examiner

*Primary Examiner* — Steven J Mottola
(74) *Attorney, Agent, or Firm* — Sughrue Mion, PLLC

(57) ABSTRACT

A sound output device is provided. The sound output device includes a vacuum tube for amplifying an audio signal; a power supply that supplies power to the vacuum tube; a first switch circuit that selectively connects the power supply to the vacuum tube; and a controller that controls the first switch circuit according to whether the vacuum tube is used.

19 Claims, 4 Drawing Sheets

SOUND OUTPUT DEVICE USING VACUUM TUBE, AUDIO APPARATUS AND METHOD FOR SOUND OUTPUT THEREOF

CROSS-REFERENCE TO RELATED APPLICATIONS

This application claims priority from Korean Patent Application No. 10-2011-0074124 filed on Jul. 26, 2011, Korean Patent Application No. 10-2011-0078958 filed on Aug. 9, 2011, and Korean Patent Application No. 10-2012-0039037 filed on Apr. 16, 2012, in the Korean Intellectual Property Office, the entire disclosures of which are herein incorporated by reference.

BACKGROUND

1. Field

Devices, apparatuses, articles of manufacture, and methods consistent with the present disclosure relate to a sound output device using a vacuum tube, an audio apparatus, and a sound output method and, more particularly, to a sound output device for extending a lifetime of a vacuum tube.

2. Description of the Related Art

In recent times, as industries are advancing, all of analog electronic devices are digitized. An analog vacuum tube amplifier can produce audio having better sound quality than other audio amplifiers, but the vacuum tube amplifier has a disadvantage in that a vacuum tube amplifier has a short life, typically merely thousands of hours.

Vacuum tubes are thus made to allow manual replacement of the vacuum tube. However, there is a disadvantage in that a user cannot easily determine whether the lifetime of the vacuum tube has run out by listening to the output sound of the audio system in person. In addition, once the vacuum tube runs out, the sound system cannot be used until the vacuum tube is replaced.

SUMMARY

One or more exemplary embodiments provide a sound output device and an audio apparatus for switching a switch unit interconnecting a vacuum tube and a power supply according to whether the vacuum tube is used or not.

One or more exemplary embodiments also provide a sound output device, an audio apparatus, and a sound output method for detecting whether a vacuum tube normally operates and outputting sound even when the vacuum tube does not normally operate.

According to an aspect of an exemplary embodiment, there is provided a sound output device including a vacuum tube for amplifying an audio signal; a power supply that supplies power to the vacuum tube; a first switch circuit that selectively connects the power supply to the vacuum tube; and a controller that controls the first switch according to whether the vacuum tube is used.

The vacuum tube may include a heater that emits electrons by heating a cathode; and a plate that collects the electrons emitted from the cathode.

The first switch circuit may include a first switch that selectively connects the power supply to the plate; and a second switch that selectively connects the power supply to the heater.

The controller may turn on the first switch and the second switch when the vacuum tube is used, and turn off at least one of the first switch and the second switch when the vacuum tube is not used.

The sound output device may include an input unit that receives the audio signal; and an amplifier that selectively amplifies the received audio signal or an output audio signal from the vacuum tube. The controller may determine whether the vacuum tube is operating normally, and control the amplifier to pass through the audio output audio signal from the vacuum tube when the vacuum tube is operating normally and to amplify the received audio signal from the input unit when the vacuum tube is not operating normally.

The controller may calculate an amplification ratio of the vacuum tube by comparing an audio signal input to the vacuum tube and the output audio signal from the vacuum tube, and determine whether the vacuum tube is operating normally based on the calculated amplification ratio.

The sound output device may further include a second switch circuit that selectively provides one of the output audio signal from the vacuum tube and the audio signal from the input unit to the amplifier. When the vacuum tube is operating normally, the controller controls the second switch circuit to provide the output audio signal from the vacuum tube to the amplifier, and when the vacuum tube is not operating normally, the controller controls the second switch circuit to provide the audio signal from the input unit to the amplifier.

The controller may adjust an amplification ratio of the amplifier according to the calculated amplification ratio of the vacuum tube.

The sound output device may further include a secondary vacuum tube for amplifying the received audio signal. When the vacuum tube is not operating normally, the controller controls to two-stage amplify the received audio signal through the secondary vacuum tube and the amplifier.

The sound output device may further include a second switch circuit that selectively provides one of the output audio signal from the vacuum tube and an output audio signal from the secondary vacuum tube to the amplifier. When the vacuum tube is operating normally, the controller controls the second switch circuit to provide the output audio signal from the vacuum tube to the amplifier, and when the vacuum tube is not operating normally, the controller controls the second switch circuit to provide the output audio signal from the secondary vacuum tube to the amplifier.

The sound output device may further include a third switch circuit that selectively provides the received audio signal to the secondary vacuum tube. When the vacuum tube is not operating normally, the controller controls the third switch circuit to provide the received audio signal to the secondary vacuum tube.

The sound output device may further include a secondary vacuum tube for amplifying the input audio signal. The controller calculates the amplification ratio of the vacuum tube by comparing an audio signal input to the vacuum tube and the output audio signal from the vacuum tube, calculates an amplification ratio of the secondary vacuum tube by comparing an audio signal input to the secondary vacuum tube and an output audio signal from the secondary vacuum tube, and determines the audio signal to amplify in the amplifier according to the calculated amplification ratio of the vacuum tube and the calculated amplification ratio of the secondary vacuum tube.

The sound output device may further include a second switch circuit that selectively provides one of the output audio signal from the vacuum tube, the output audio signal from the secondary vacuum tube, and the received audio signal to the amplifier. When the vacuum tube is operating normally, the controller controls the second switch circuit to provide the output audio signal from the vacuum tube to the amplifier, when the vacuum tube is not operating normally and the secondary vacuum tube is operating normally, the controller controls the second switch circuit to provide the output audio signal from the secondary vacuum tube to the amplifier, and when the vacuum tube is not operating normally and the secondary vacuum tube is not operating normally, the controller controls the second switch circuit to provide the received audio signal to the amplifier.

According to an aspect of another exemplary embodiment, there is provided an audio apparatus including a communication interface that receives audio content; an audio processor that processes the audio content into a plurality of audio signals; at least one vacuum tube for selectively amplifying the plurality of audio signals; a power supply that supplies power to the vacuum tube; a first switch that selectively connects the power supply to the vacuum tube; and a controller that controls the first switch according to whether the vacuum tube is used.

The vacuum tube may include a heater that emits electrons by heating a cathode; and a plate that collects the electrons emitted from the cathode. The first switch circuit may include a first switch that selectively connects the power supply to the plate; and a second switch that selectively connects the power supply to the heater. The controller turns on the first switch and the second switch when the vacuum tube is used, and turns off at least one of the first switch and the second switch when the vacuum tube is not used.

The audio apparatus may further include an amplifier that selectively amplifies and outputs the audio signals from the audio processor or an output signal from the at least one vacuum tube. The controller determines the signal to input to the amplifier according to whether the at least one vacuum tube is operating normally.

The audio apparatus may further include a user interface that, when the vacuum tube is not operating normally, notifying a user of an abnormal operation of the vacuum tube.

The at least one vacuum tube may include one vacuum tube, and the controller may determine whether the vacuum tube is operating normally according to an amplification ratio of the vacuum tube, control to two-stage amplify the audio signals through the vacuum tube and the amplifier when the vacuum tube is operating normally, and control to one-stage amplify the audio signals through the amplifier when the vacuum tube is not operating normally.

The audio apparatus may include a second switch circuit that selectively provides one of the output audio signal of the vacuum tube and the audio signals to the amplifier. When the vacuum tube is operating normally, the controller controls the switch unit to provide the output audio signal of the vacuum tube to the amplifier, and when the vacuum tube is not operating normally, the controller controls the switch unit to provide the audio signals to the amplifier.

According to an aspect of another exemplary embodiment, there is provided a sound output method of a sound output device for selectively amplifying an input audio signal using at least one vacuum tube, the method including inputting an audio signal; selectively amplifying the input audio signal using the vacuum tube; determining whether the vacuum tube is operating normally; and wherein selectively amplifying the input audio signal comprises two-stage amplifying the audio signal by the vacuum tube and an amplifier when the vacuum tube is operating normally, and one-stage amplifying the audio signal through the amplifier without inputting the audio signal to the vacuum tube when the vacuum tube is not operating normally.

BRIEF DESCRIPTION OF THE DRAWINGS

These above and/or other aspects will become apparent and more readily appreciated from the following description of exemplary embodiments, taken in conjunction with the accompanying drawings of which.

DETAILED DESCRIPTION

Reference will now be made in detail to exemplary embodiments of the present general inventive concept, examples of which are illustrated in the accompanying drawings, wherein like reference numerals refer to the like elements throughout. The exemplary embodiments are described below to explain the present general inventive concept by referring to the figures.

In recent times, as industries are advancing, all of analog electronic devices are digitized, and sound systems seek sound quality enhancement in accordance with the rapid digitization.

However, an analog vacuum tube amplifier is dominant in terms of sound quality because of the amplification difference of digital techniques in the sound. In detail, the digital type amplification using a transistor is subject to some delay when the transistor amplifies the sound, as compared with direct amplification. Since the delay causes some change of the amplified waveform in the amplification, digital type amplification differs from the analog type amplification which uses a vacuum tube to amplify the original signal as it is. In this point, high-end stereo systems amplify the audio signal using a vacuum tube amplifier.

A vacuum tube amplifier can produce audio having better sound quality than other audio amplifiers, but the vacuum tube amplifier has a shorter life, typically merely thousands of hours.

Particularly, a related art vacuum tube amplifier always supplies power to the vacuum tube so that the current flows through the vacuum tube even when the vacuum tube is not used. Hence, the current passes through the vacuum tube which is not being used and thus the lifetime of the vacuum tube is shortened.

Additionally, vacuum tubes are fabricated to allow a user to manually replace a socket. However, it is hard for the user to determine whether the lifetime of the vacuum tube has run out by listening to the output sound of the audio system in person. In addition, when the lifetime of the vacuum tube comes to an end, the sound system is out of use until the vacuum tube is replaced.

Figure 1:
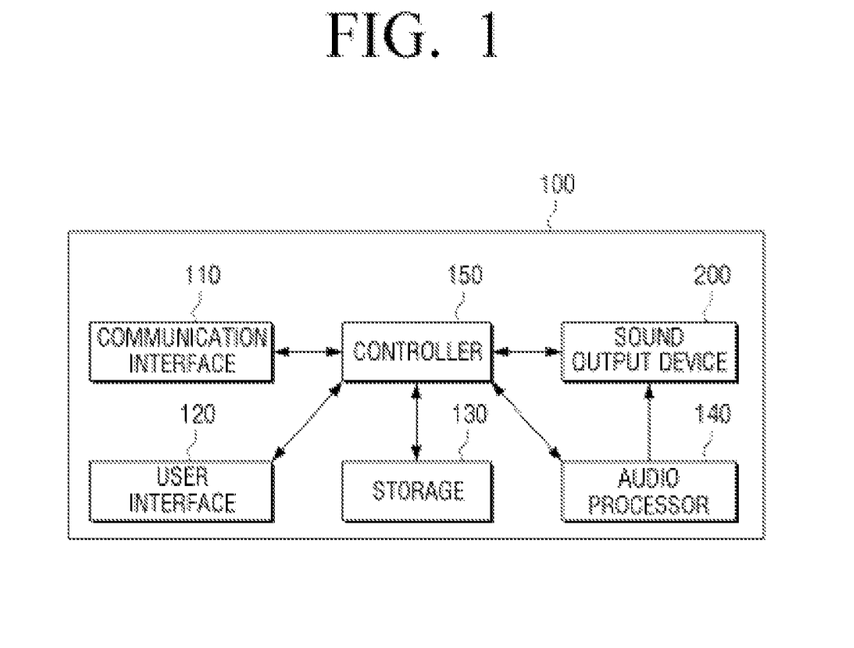
FIG. 1 is a block diagram of an audio apparatus according to an exemplary embodiment.

FIG. 1 is a block diagram of an audio apparatus according to an exemplary embodiment.

As shown in FIG. 1, the audio apparatus 100 includes a communication interface 110, a user interface 120, a storage 130, an audio processor 140, a controller 150, and one or more sound output devices 200.

Herein, the audio apparatus 100 can be, but not limited to, a sound amplifier such as Home Theater System (HTS) and amplifier including a vacuum tube. The present general inventive concept is applicable to any audio apparatus for receiving, processing, and outputting an audio signal.

The communication interface 110 is connected to at least one external device (e.g., a computer, a television, a set-top box, a digital satellite broadcasting receiver, a video tape recorder (VTR), a digital versatile disk (DVD) player, etc.), and can receive audio content from the external device. Herein, the audio content includes at least one audio signal, and can be analog content or digital content. Herein, the audio signal is an electric signal for one sound wave channel.

The user interface 120 includes a plurality of function keys allowing a user to set or select various functions supported in the audio apparatus 100, and can display various information provided from the audio apparatus 100.

Herein, the user interface 120 can be implemented using an input/output (I/O) device such as touch pad, or by combining an input device such as a mouse and/or a keyboard with a display device such as light emitting diodes (LEDs) and/or a liquid crystal display (LCD). The user can adjust the sound volume using the user interface 120.

When the vacuum tube does not normally operate, the user interface 120 can display the abnormal operation to the user. For example, the user interface 120 can display a message or an LED requesting the replacement of the vacuum tube.

The user interface 120 may display information of the switching between the vacuum tube and a power supply according to whether the vacuum tube is used or not.

The storage 130 can store the audio content received through the communication interface 110. When the received audio content is analog, the storage 130 can digitize and store the audio content. The storage 130 can be implemented using a hard disc, a non-volatile memory, and/or a volatile memory.

The audio processor 140 decodes the input audio content or the audio content stored to the storage 130. The audio processor 140 divides the processed audio content to a plurality of audio signals.

For example, when the audio content is a stereo audio signal, the audio processor 140 can divide the audio content into a left audio signal and a right audio signal. When the audio content is a 2.1 channel audio signal, the audio processor 140 can divide the audio content into a left audio signal, a right audio signal, and a woofer audio signal. When the audio content is a 5.1 channel audio signal, the audio processor 140 can divide the audio content into a front left audio signal, a front right audio signal, a surround left audio signal, a surround right audio signal, and a woofer audio signal. Additionally, it is possible for the audio content to be monaural in which only one audio signal is provided.

The audio processor 140 can send the split audio signal to the corresponding sound output device 200. In detail, the sound output device 200 is connected to a particular speaker to provide the audio signal corresponding to the speaker. For example, when the audio processor 140 splits the stereo audio content to the left audio signal and the right audio signal, the audio processor 140 can provide the left audio signal to the sound output device connected to a left speaker and the right audio signal to the sound output device connected to a right speaker.

The sound output devices 200 amplify the split audio signals using the vacuum tube and output the amplified audio signals to the connected speakers. In detail, the sound output devices 200 each amplify the audio signal processed by the audio processor 140 using the vacuum tube and send the amplified audio signal to the connected speaker. In a monaural environment, one sound output device 200 amplifies the signal audio signal using the vacuum tube and outputs the amplified signal to a connected speaker.

Figure 2:
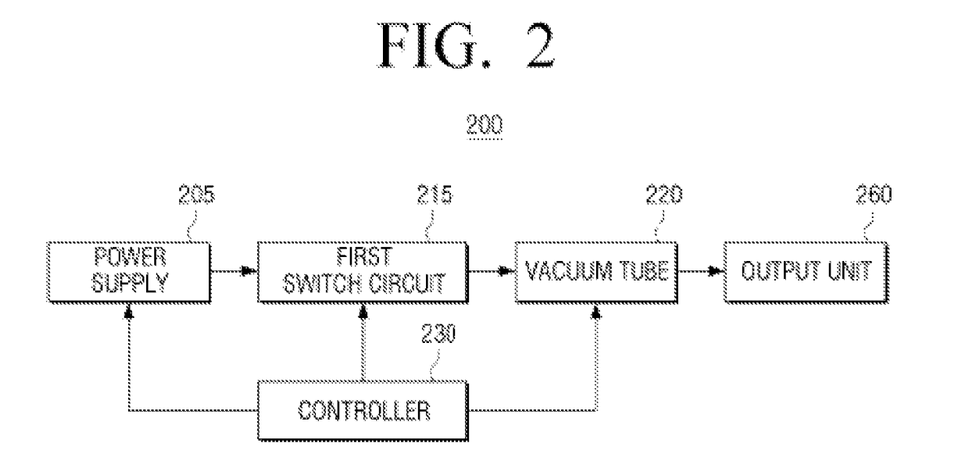
FIG. 2 is a block diagram of a sound output device according to an exemplary embodiment.
Figure 3:
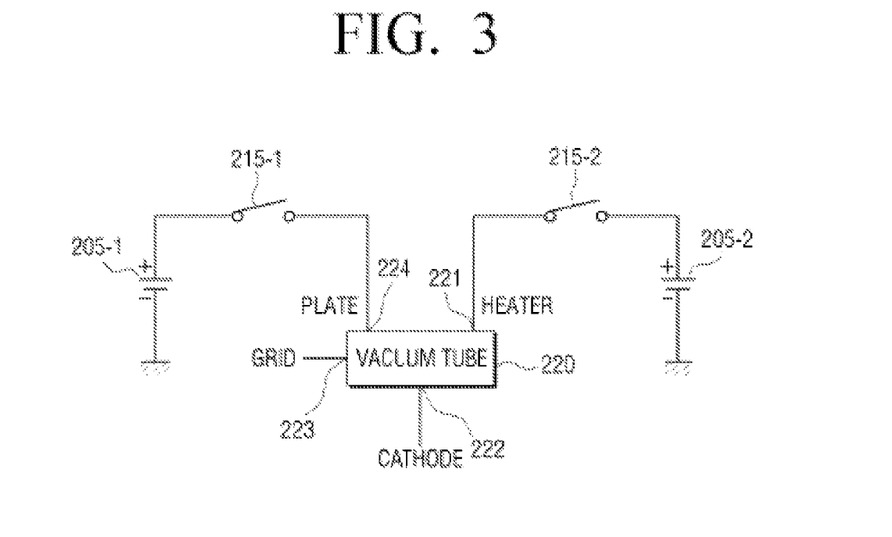
FIG. 3 is a circuit diagram of the sound output device of FIG. 2.

As shown in FIGS. 2 and 3 and will be described in more detail later, a sound output device 200 can control a first switch circuit 215 between the vacuum tube 220 and the power supply which supplies the power to the vacuum tube 220, according to whether the vacuum tube 220 is used. In detail, when the audio signal is input to the sound output device 200 and the vacuum tube 220 is used, the sound output device 200 can turn on the first switch circuit 215 between the vacuum tube 220 and the power supply 205. When the audio signal is not input to the sound output device 200 and the vacuum tube 220 is not used, the sound output device 200 can turn off the first switch circuit 215 between the vacuum tube 110 and the power supply 205. Detailed structure and operations of the sound output device 200 for switching according to the use of the vacuum tube shall be explained later in reference to FIGS. 2 and 3.

Figure 4:
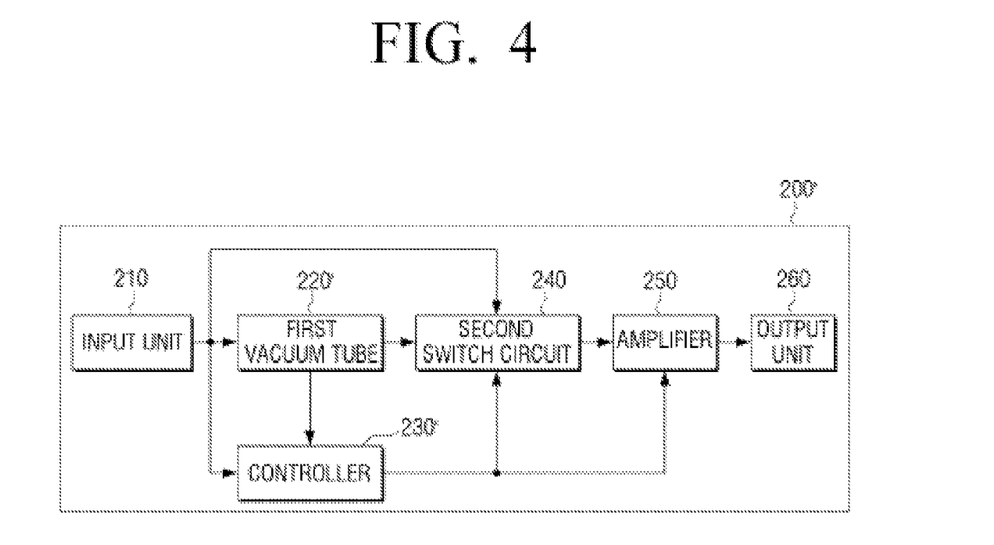
FIG. 4 is a block diagram of a sound output device according to another exemplary embodiment.

Additionally, as shown in FIG. 4 and will be described in more detail later, a sound output device 200' may calculate an amplification ratio of the vacuum tube and determine whether the vacuum tube is operating normally by comparing the input audio signal and the output audio signal of the vacuum tube. When the vacuum tube is operating normally, the sound output device 200' may two-stage amplify the audio signal and provide the two-stage amplified audio signal to the speaker. When the vacuum tube is not operating normally, the sound output device 200' may two-stage amplify the audio signal using a separate secondary vacuum tube or one-stage amplify the audio signal and then provide the amplified audio signal to the speaker. Detailed structure and operations of the sound output device 200' shall be explained later in reference to FIG. 4.

The sound output devices 200 can be equipped in an external case separately from the other components, or in a single case together with the other components. When the sound output devices 200 are provided outside as a separate unit, they can wirelessly receive, amplify, and output the processed audio signal.

The controller 150 can control the components of the audio apparatus 100. In detail, when the audio content is received through the communication interface 110, the controller 150 can forward the received audio content to the audio processor 140 to convert the audio content to the plurality of the audio signals, and control the sound output devices 200 to provide the split audio signals to the plurality of the speakers.

When the vacuum tube is worn out, the controller 150 can control the user interface 120 to display a message informing of the expired vacuum tube or a vacuum tube replacement message.

According to whether the vacuum tube 220 of the sound output device 200 is used, the controller 150 can control the switching of a first switch circuit 215 interposed between the vacuum tube 220 of the sound output device 200 and the power supply 205 which supplies the power to the vacuum tube 220.

While one sound output device processes one channel (i.e., one audio signal) in FIG. 1, one sound output device may process a plurality of channels.

Hereafter, the sound output device 200 according to an exemplary embodiment is described in more detail by referring to FIGS. 2 and 3.

FIG. 2 is a block diagram of the sound output device 200 according to an exemplary embodiment. As shown in FIG. 2, the sound output device 200 includes a power supply 205, a first switch circuit 215, a vacuum tube 220, an output unit 260, and a controller 230.

The power supply 205 supplies the power to the components of the sound output device 200. In particular, the power supply 205 supplies the power to a heater 221 and a plate 224 of the vacuum tube 220 to amplify the input audio signal through the vacuum tube 220 (see FIG. 3).

The first switch circuit 215 is interposed between the power supply 205 and the vacuum tube 220 and switches under the control of the controller 230.

The vacuum tube 220 amplifies the input audio signal. The vacuum tube 220 includes four electrodes including the heater 221, a cathode 222, a grid 223, and the plate 224.

The heater 221 heats the cathode by generating heat using a thin metal line. The cathode 222 is heated by the heater to emit electrons. The grid 223 controls the electrons emitted from the cathode. The plate 224 which is a metal plate surrounding the cathode absorbs the electrons. In particular, the grid 223 controls the electrons emitted from the cathode to carry out the amplification of the vacuum tube.

The output unit 260 is connected to the speaker. The output unit 260 is formed to connect the sound output device 200 and the speaker and to provide the output signal of the vacuum tube 220 to the speaker.

The controller 230 controls the operations of the sound output device 200. According to the use of the vacuum tube 220, the controller 230 controls the first switch circuit 215 interposed between the vacuum tube 220 and the power supply 205.

In more detail, the controller 230 determines whether the vacuum tube 220 is used, that is, whether the vacuum tube 220 amplifies the input audio signal. When the audio signal is input and the vacuum tube 220 is used, the controller 230 turns on the first switch circuit 215 to supply the power to the vacuum tube 220. When the audio signal is not input from the outside and the vacuum tube 220 is not used, the controller 230 turns off the first switch circuit 215 to cut the power supply to the vacuum tube 220.

Hence, when the vacuum tube 220 is not used, the power supply is cut and the current does not pass through the vacuum tube 220, thus extending the lifetime of the vacuum tube 220.

FIG. 3 is a circuit diagram of the sound output device 200 of FIG. 2.

As shown in FIG. 3, the sound output device 200 includes the vacuum tube 220 including the electrodes of the heater 221, the cathode 222, the grid 223, and the plate 224, first and second power supplies 205-1 and 205-2 for supplying the power to the vacuum tube 220, and a first switch 215-1 and a second switch 215-2 for interconnecting the first and second power supplies 205-1 and 205-2 and the vacuum tube 220. The first and second power supplies 205-1 and 205-2 are connected to the plate 224 and the heater 221 of the vacuum tube 220.

According to the use of the vacuum tube 220, the controller 230 controls the first switch 215-1 interconnecting the first power supply 205-1 and the plate 224 and the second switch 215-2 interconnecting the second power supply 205-2 and the heater 221.

In detail, when the audio signal is input to the sound output device 200 and the vacuum tube 220 is used, the controller 230 turns on the first switch 215-1 and the second switch 215-2 to supply the current to the heater 221 and the plate 224. Thus, as the current flows through the heater 221 and the plate 224, the vacuum tube 220 amplifies and outputs the input audio signal to the output unit 260.

However, when the audio signal is not input to the sound output device 200 and the vacuum tube 220 is not used, the controller 230 turns off the first switch 215-1 and the second switch 215-2 to block the current to the heater 221 and the plate 224. Thus, when the vacuum tube 220 is not used, the current to the vacuum tube 220 is blocked and thus avoids the unnecessary consumption of the vacuum tube 220.

While both of the first switch 215-1 and the second switch 215-2 are turned off when the vacuum tube 220 is not used in FIG. 3, it is alternatively possible to turn off only one of the first switch 215-1 and the second switch 215-2.

While the first and second power supplies 205-1 and 205-2 are separately equipped to supply the current to the heater 221 and the plate 224 in FIG. 3, the same power supply 205 can be used to supply power to the heater 221 and the plate 224.

Accordingly, the sound output device 200 can block unnecessary current supply to the vacuum tube 220 and thus the vacuum tube 200 can last longer than a conventional vacuum tube.

FIG. 4 is a block diagram of a sound output device according to another exemplary embodiment.

Referring to FIG. 4, the sound output device 200' includes an input unit 210, a first vacuum tube 220', a controller 230', a second switch circuit 240, an amplifier 250, and an output unit 260.

The input unit 210 receives the audio signal. In particular, the input unit 210 can receive the audio signal from the audio processor 140.

The first vacuum tube 220' selectively amplifies the audio signal. In detail, the first vacuum tube 220' can amplify in a preset amplification ratio the audio signal input through the input unit 210. Herein, the preset amplification ratio is the amplification ratio supported by the first vacuum tube 220'.

The controller 230' determines whether the first vacuum tube 220' is operating normally. When the vacuum tube is worn out or malfunctions, its output differs from that output normally. Hence, the controller 230' can calculate the amplification ratio of the first vacuum tube 220' by comparing the input audio signal and the output audio signal of the first vacuum tube 220', and determine whether the first vacuum tube 220' is operating normally based on whether the calculated amplification ratio is in a normal range. The normal range may be determined experimentally.

When the first vacuum tube 220' is operating normally, the controller 230' controls the second switch circuit 240 and the amplifier 250 to send the audio signal amplified by the first vacuum tube 220' to the speaker. More specifically, when the first vacuum tube 220' is operating normally, the controller 230' can control the second switch circuit 240 to send the audio signal amplified by the first vacuum tube 220' to the amplifier 250 so that the two-stage amplified audio signal is forwarded to the speaker. In so doing, the controller 230' can control the amplifier 250 to set the preset amplification ratio of the amplifier 250 to 1. While the amplifier 250 is controlled to set the preset amplification ratio to 1 by way of example, the amplification ratio can change in a modified implementation.

By contrast, when the first vacuum tube 220' is not operating normally (e.g., due to a malfunction, abnormality, or other problem), the controller 230' can control the second switch circuit 240 and the amplifier 250 to amplify and send the audio signal not passing through the first vacuum tube 220', which is hereafter referred to as a bypassed audio signal, to the speaker. In detail, the controller 230' can control the second switch circuit 240 to send the bypassed audio signal to the amplifier 250, and control the amplifier 250 to amplify the bypassed audio signal in an amplification ratio as when the first vacuum tube 220' is operating normally. That is, the controller 230' can control the second switch circuit 240 and the amplifier 250 to one-stage amplify the input audio signal.

When the first vacuum tube 220' is not operating normally, the controller 230' can notify the controller 150 of the abnormal operation of the first vacuum tube 220' controller.

The second switch circuit 240 selectively provides one of the output of the first vacuum tube 220' and the bypassed audio signal to the amplifier 250. In detail, under the control of the controller 230', the second switch circuit 240 can provide the audio signal amplified by the first vacuum tube 220' to the amplifier 250 when the first vacuum tube 220' is operating normally, and provide the bypassed audio signal to the amplifier 250 when the first vacuum tube 220' is not operating normally.

The amplifier 250 amplifies the audio signal in the preset amplification ratio and provides the amplified audio signal to the output unit 260. The amplifier 250 may digitally amplify the audio signal. Under the control of the controller 230', when the first vacuum tube 220' is operating normally, the amplifier 250 can amplify the audio signal amplified by the first vacuum tube 220' in the amplification ratio of 1 and provide the amplified audio signal to the output unit 260 (i.e., without additional amplification). When the first vacuum tube 220' abnormally operates, the amplifier 250 can amplify the bypassed audio signal in the amplification ratio of the normal operation of the first vacuum tube 220' and provide the amplified audio signal to the output unit 260.

The output unit 260 is connected to the speaker. The output unit 260 connects the sound output device 200' to a speaker and to provide the output signal of the amplifier 250 to the speaker. While the amplified audio signal is fed to the speaker using the output unit 260 in this exemplary embodiment, the amplified audio signal may be provided directly to the speaker in a modified implementation.

As above, the sound output device 200' can easily determine whether the vacuum tube malfunctions, and amplify and provide the bypassed audio signal to the speaker. Hence, when the vacuum tube is worn out or abnormal, the sound output device 200' can normally operate.

While the amplifier 250 is connected to the rear end of the second switch circuit 240 in FIG. 4, the amplifier 250 may be connected to the front end of the first amplifier 250 in the implementation.

Figure 5:
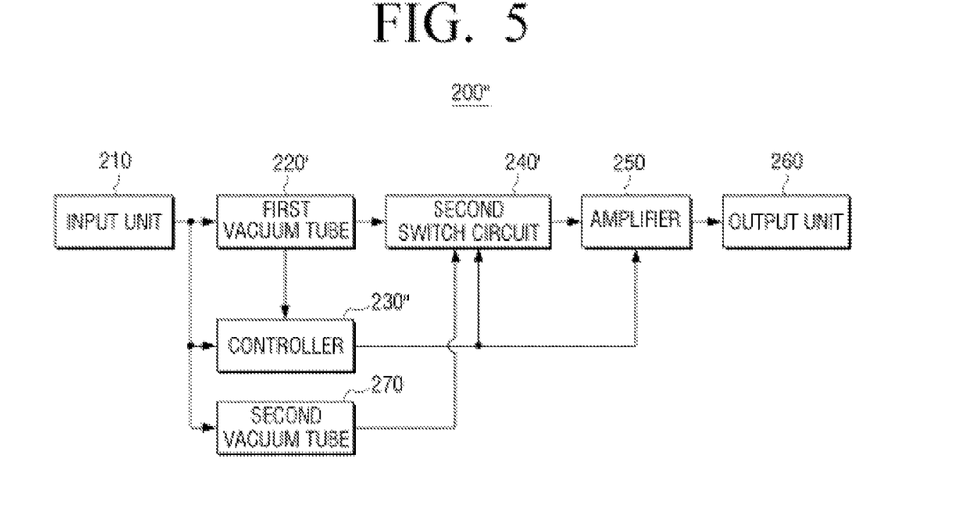
FIG. 5 is a block diagram of a sound output device according to yet another exemplary embodiment.

FIG. 5 is a block diagram of a sound output device according to yet another exemplary embodiment.

Referring to FIG. 5, the sound output device 200" includes an input unit 210, a first vacuum tube 220', a controller 230", a second switch circuit 240', an amplifier 250, an output unit 260, and a second vacuum tube 270.

The input unit 210 receives the audio signal. In particular, the input unit 210 can receive the audio signal from the audio processor 140.

The first vacuum tube 220' amplifies the audio signal. The first vacuum tube 220' receives the audio signal from the input unit 210 and can amplify the audio signal input in the preset amplification ratio.

The controller 230" determines whether the first vacuum tube 220' is operating normally. In detail, the controller 230" can calculate the amplification ratio of the first vacuum tube 220' by comparing the input audio signal and the output audio signal of the first vacuum tube 220', and determine whether the first vacuum tube 220' is operating normally according to whether the calculated amplification ratio is in the normal range.

When the first vacuum tube 220' is operating normally, the controller 230" controls the second switch circuit 240' and the amplifier 250 to send the audio signal amplified by the first vacuum tube 220' to the speaker. In detail, when the first vacuum tube 220' is operating normally, the controller 230" controls the second switch circuit 240' to send the audio signal amplified by the first vacuum tube 220' to the speaker.

By contrast, when the first vacuum tube 220' is not operating normally, the controller 230" can control the second switch circuit 240' to send the audio signal amplified by the second vacuum tube 270 to the speaker.

When the first vacuum tube 220' is not operating normally, the controller 230" can notify the abnormal operation of the first vacuum tube 220' to the controller 150.

The second switch circuit 240' selectively provides the audio signal output from the first vacuum tube 220' and the audio signal output from the second vacuum tube 270 to the amplifier 250. Under the control of the controller 230", the second switch circuit 240' can provide the amplifier 250 with the output audio signal of the first vacuum tube 220' when the first vacuum tube 220' is operating normally, and provide the amplifier 250 with the output of the second vacuum tube 270 when the first vacuum tube 220' is not operating normally.

The amplifier 250 amplifies the audio signal in the preset amplification ratio and provides the amplified audio signal to the output unit 260.

The output unit 260 is connected to the speaker. The output unit 260 connects the sound output device 200" and a speaker and to provide the output signal of the amplifier 250 to the speaker. While the amplified audio signal is fed to the speaker using the output unit 260 in this exemplary embodiment, the amplified audio signal may be provided directly to the speaker in a modified implementation.

The second vacuum tube 270 (also called a secondary vacuum tube) amplifies the audio signal. The second vacuum tube 270 can amplify the audio signal input through the input unit 210 in a preset amplification ratio.

As above, the sound output device 200" can easily determine whether the vacuum tube is operating normally or is not operating normally (e.g., due to a malfunction, abnormality, or other problem, etc.). Even when one vacuum tube is not operating normally, the sound output device 200" can normally function using the other vacuum tube.

While the amplifier 250 is connected to the rear end of the second switch circuit 240' in FIG. 5, the amplifier 250 may be omitted in a modified implementation.

Figure 6:
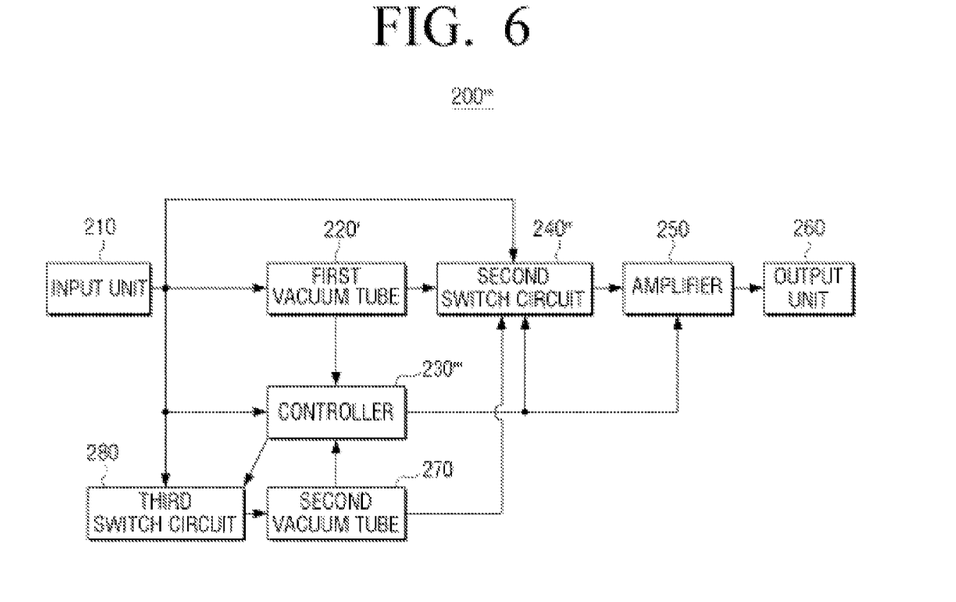
FIG. 6 is a block diagram of a sound output device according to still another exemplary embodiment.

FIG. 6 is a block diagram of a sound output device according to still another exemplary embodiment.

Referring to FIG. 6, the sound output device 200''' includes an input unit 210, a first vacuum tube 220', a controller 230''', a second switch circuit 240", an amplifier 250, an output unit 260, a second vacuum tube 270, and a third switch circuit 280.

The input unit 210 receives the audio signal. In particular, the input unit 210 can receive the audio signal from the audio processor 140.

The first vacuum tube 220' amplifies the audio signal. The first vacuum tube 220' can amplify in the preset amplification ratio the audio signal input through the input unit 210.

The controller 230''' determines whether the first vacuum tube 220' is operating normally. When the vacuum tube is worn out or malfunctions, its output differs from that output normally. Hence, the controller 230''' can calculate the amplification ratio of the first vacuum tube 220' by comparing the input audio signal and the output audio signal of the first vacuum tube 220', and determine whether the first vacuum tube 220' is operating normally according to whether the calculated amplification ratio is in a normal range.

When the first vacuum tube 220' is operating normally, the controller 230''' controls the second switch circuit 240" and the amplifier 250 to send the audio signal amplified by the first vacuum tube 220' to the speaker. More specifically, when the first vacuum tube 220' is operating normally, the controller

230''' can control the second switch circuit 240" to send the audio signal amplified by the first vacuum tube 220' to the amplifier 250 and control the amplifier 250 to set the amplification ratio of the amplifier 250 to 1 (i.e., without additional amplification). The controller 230''' can control the third switch circuit 280 not to operate the second vacuum tube 270.

By contrast, when the first vacuum tube 220' is not operating normally, the controller 230''' controls the third switch circuit 280, the second switch circuit 240" and the amplifier 250 to send the audio signal amplified by the second vacuum tube 270 to the speaker. In detail, when the first vacuum tube 220' is not operating normally, the controller 230''' can control the third switch circuit 280 to send the input audio signal to the second vacuum tube 270, control the second switch circuit 240" to send the audio signal amplified by the second vacuum tube 270 to the speaker, and control the amplifier 250 to set its amplification ratio to 1 (i.e., without additional amplification).

In so doing, the controller 230''' determines whether the second vacuum tube 270 is operating normally. The controller 230''' can calculate the amplification ratio of the second vacuum tube 270 by comparing the input audio signal and the output audio signal of the second vacuum tube 270, and determine whether the second vacuum tube 270 is operating normally according to whether the calculated amplification ratio is in a normal range. The normal range may be determined experimentally.

According to the determination result, when the second vacuum tube 270 is not operating normally (i.e., when neither the first vacuum tube 220' nor the second vacuum tube 270 is operating normally), the controller 230''' can control the second switch circuit 240" and the amplifier 250 to amplify and send the audio signal (the bypass audio signal) not passed through the first vacuum tube 220' and not passed through the second vacuum tube 270 to the speaker. More specifically, the controller 230''' can control the second switch circuit 240" to send the bypassed audio signal to the amplifier 250, and control the amplifier 250 to amplify the bypassed audio signal in an amplification ratio corresponding to the amplification ratio set for the first vacuum tube 220' (that is, a same amplification ratio as the first vacuum tube 220' would use if the first vacuum tube 220' were operating normally).

When at least one of the first vacuum tube 220' and the second vacuum tube 270 is not operating normally, the controller 230''' can notify the controller 150 of the abnormal operation of the first vacuum tube 220 or the second vacuum tube 270.

The second switch circuit 240" selectively provides the output of the first vacuum tube 220', the output of the second vacuum tube 270, and the bypassed audio signal (the audio signal input from the input unit 210) to the amplifier 250. Under the control of the controller 230''', the second switch circuit 240" can provide the amplifier 250 with the output audio signal of the first vacuum tube 220' when the first vacuum tube 220' is operating normally, provide the amplifier 250 with the output audio signal of the second vacuum tube 270 when the first vacuum tube 220 is not operating normally and the second vacuum tube 270 is operating normally, and provide the bypassed audio signal to the amplifier 250 when both of the first vacuum tube 220 and the second vacuum tube 270 are not operating normally.

The second switch circuit 240" selectively provides the output of the first vacuum tube 220, the output of the second vacuum tube 270, and the bypassed audio signal (the audio signal input from the input unit 210) to the amplifier 250.

The amplifier 250 amplifies the audio signal in the preset amplification ratio and provides the amplified audio signal to the output unit 260. More specifically, when the first vacuum tube 220' is operating normally, under the control of the controller 230''', the amplifier 250 can amplify the audio signal amplified by the first vacuum tube 220' in the amplification ratio of 1 and provide the amplified audio signal to the output unit 260 (i.e., without addition amplification). When the first vacuum tube 220 is not operating normally and the second vacuum tube 270 is operating normally, under the control of the controller 230''', the amplifier 250 can amplify the audio signal amplified by the second vacuum tube 270 in the amplification ratio of 1 and provide the amplified audio signal to the output unit 260. When both of the first vacuum tube 220 and the second vacuum tube 270 are not operating normally, under the control of the controller 230''', the amplifier 250 can amplify the bypassed audio signal in the amplification ratio of the normal operation of the first vacuum tube 220' and provide the amplified audio signal to the output unit 260.

The output unit 260 is connected to a speaker. The output unit 260 connects the sound output device 200''' to the speaker and provides the output signal of the amplifier 250 to the speaker. While the amplified audio signal is fed to the speaker using the output unit 260 in this exemplary embodiment, the amplified audio signal may be provided directly to the speaker in a modified implementation.

The second vacuum tube 270 (also called a secondary vacuum tube) amplifies the audio signal. The second vacuum tube 270 can amplify the audio signal input through the third switch circuit 280 in a preset amplification ratio.

The third switch circuit 280 selectively provides the input audio signal to the second vacuum tube 270. Under the control of the controller 230''', the third switch circuit 280 can block the audio signal input to the second vacuum tube 270 when the first vacuum tube 220 is operating normally, and input the audio signal to the second vacuum tube 270 when the first vacuum tube 220 is not operating normally. As such, by means of the third switch circuit 280, a reduction of the lifespan of the second vacuum tube 280 can be avoided.

As above, the sound output device 200''' can easily determine through the controller 230''' whether the vacuum tube is not operating normally or the vacuum tubes are not operating normally. Even when one vacuum tube is out of order, the sound output device 200''' can normally function using the other vacuum tube. When neither of the two vacuum tubes are out of order, the sound output device 200''' amplifies and provides the bypassed audio signal to the speaker. Hence, the sound output device 200''' can normally operate even when the one or more vacuum tubes are worn out or malfunctioning.

While the amplifier 250 is connected to the rear end of the second switch circuit 240" in FIG. 6, the amplifier 250 may receive the audio signal of the input unit 210 at the front end of the second switch circuit 240" and forward the audio signal to the second switch circuit 240" in a modified implementation.

While only two vacuum tubes are depicted in FIGS. 5 and 6, three or more vacuum tubes can be employed in a modified implementation.

Figure 7:
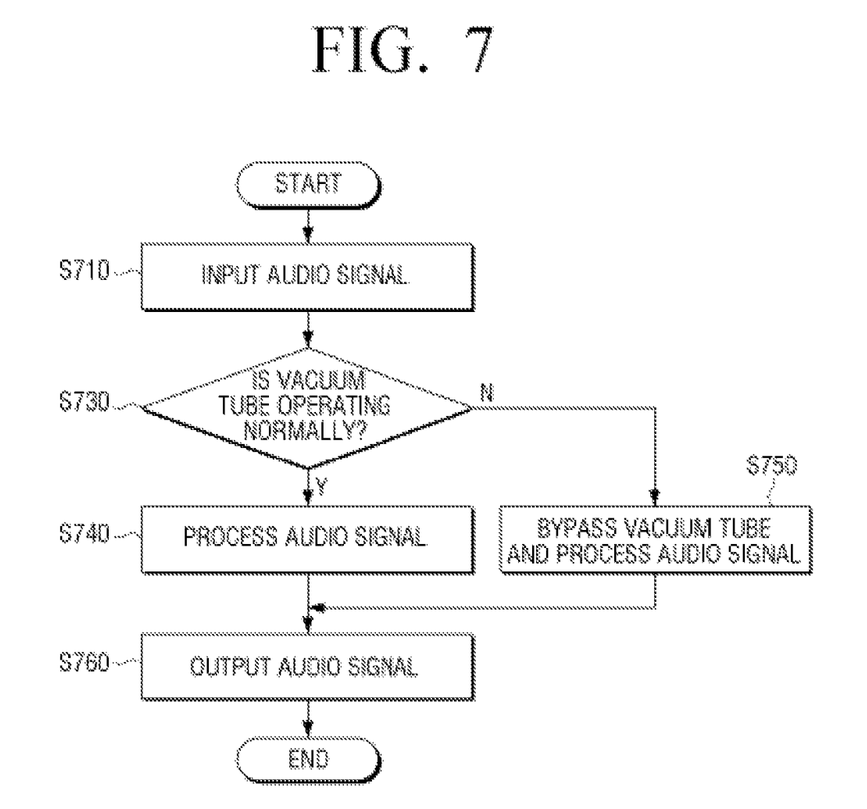
FIG. 7 is a diagram of a sound output method according to an exemplary embodiment.

FIG. 7 is a diagram of a sound output method according to an exemplary embodiment.

Referring to FIG. 7, an audio signal is input (S710).

It is determined whether the vacuum tube is operating normally (S730). The determination is made by comparing the input audio signal and the audio signal amplified by the vacuum tube. In detail, when the vacuum tube is not operating normally, its output differs from that which is output under normal operating conditions. Hence, the amplification ratio of the vacuum tube may be calculated by comparing the input audio signal and the output audio signal of the vacuum tube, and it may be determined whether the vacuum tube is operating normally based on whether the calculated amplification ratio is in a normal range. The normal range may be determined experimentally.

When the vacuum tube is operating normally (S730-Y), the audio signal is processed. (S740). For example, the audio signal is amplified by the vacuum tube in a preset amplification ratio and the amplified audio signal is output to the speaker (S760). In further detail, when the vacuum tube is operating normally, the audio signal amplified by the vacuum tube is output to the speaker.

When the vacuum tube is not operating normally (S730-N), the vacuum tube is bypassed and input audio signal is amplified in a preset amplification ratio by the amplifier (S750) and output to the speaker (S760). That is, when the vacuum tube is not operating normally, the input audio signal is amplified by the amplifier and sent to the speaker. Herein, the preset amplification ratio can be the amplification ratio for the amplification when the vacuum tube normally works.

As above, even when the vacuum tube is not operating normally, the bypassed audio signal can be amplified and output to the speaker. The sound output method of FIG. 7 can be fulfilled in the audio apparatus of FIG. 1 or the sound output device 200' of FIG. 4, or in other audio apparatuses or sound output devices.

Although a few exemplary embodiments of the present general inventive concept have been shown and described, it would be appreciated by those skilled in the art that changes may be made in these exemplary embodiments without departing from the principles and spirit of the inventive concept, the scope of which is defined in the claims and their equivalents.

What is claimed is:

1. A sound output device comprising:
a vacuum tube for amplifying an audio signal;
a power supply that supplies power to the vacuum tube;
a first switch circuit that selectively connects the power supply to the vacuum tube; and
a controller that controls the first switch circuit according to whether the vacuum tube is used,
wherein the vacuum tube comprises:
a heater that emits electrons by heating a cathode; and
a plate that collects the electrons emitted from the cathode,
wherein the first switch circuit comprises:
a first switch that selectively connects the power supply to the plate; and
a second switch that selectively connects the power supply to the heater.

2. The sound output device of claim 1, wherein the controller turns on the first switch and the second switch when the vacuum tube is used, and turns off at least one of the first switch and the second switch when the vacuum tube is not used.

3. A sound output device comprising:
a vacuum tube for amplifying an audio signal;
a power supply that supplies power to the vacuum tube;
a first switch circuit that selectively connects the power supply to the vacuum tube;
a controller that controls the first switch circuit according to whether the vacuum tube is used;
an input unit that receives the audio signal; and
an amplifier that selectively amplifies the received audio signal or an output audio signal from the vacuum tube,
wherein the controller determines whether the vacuum tube is operating normally, and controls the amplifier to pass through the output audio signal from the vacuum tube when the vacuum tube is determined to be operating normally and to amplify the received audio signal from the input unit when the vacuum tube is determined to be not operating normally.

4. The sound output device of claim 3, wherein the controller calculates an amplification ratio of the vacuum tube by comparing an input audio signal to the vacuum tube and the output audio signal from the vacuum tube, and determines whether the vacuum tube is operating normally based on the calculated amplification ratio.

5. The sound output device of claim 3, further comprising:
a second switch circuit that selectively provides one of the output audio signal from the vacuum tube and an audio signal from the input unit to the amplifier,
wherein, when the vacuum tube is operating normally, the controller controls the second switch circuit to provide the output audio signal from the vacuum tube to the amplifier, and
when the vacuum tube is not operating normally, the controller controls the second switch circuit to provide the audio signal from the input unit to the amplifier.

6. The sound output device of claim 5, wherein the controller adjusts an amplification ratio of the amplifier according to the calculated amplification ratio of the vacuum tube.

7. The sound output device of claim 4, further comprising:
a secondary vacuum tube for amplifying the received audio signal,
wherein, when the vacuum tube is not operating normally, the controller controls to two-stage amplify the received audio signal through the secondary vacuum tube and the amplifier.

8. The sound output device of claim 7, further comprising:
a second switch circuit that selectively provides one of the output audio signal from the vacuum tube and an output audio signal from the secondary vacuum tube to the amplifier,
wherein, when the vacuum tube is operating normally, the controller controls the second switch circuit to provide the output audio signal from the vacuum tube to the amplifier, and
when the vacuum tube is not operating normally, the controller controls the second switch circuit to provide the output audio signal from the secondary vacuum tube to the amplifier.

9. The sound output device of claim 8, further comprising:
a third switch circuit that selectively provides the received audio signal to the secondary vacuum tube,
wherein, when the vacuum tube is not operating normally, the controller controls the third switch circuit to provide the received audio signal to the secondary vacuum tube.

10. The sound output device of claim 3, further comprising:
a secondary vacuum tube for amplifying the received audio signal,
wherein the controller calculates the amplification ratio of the vacuum tube by comparing an audio signal input to the vacuum tube and the output audio signal from the vacuum tube, calculates an amplification ratio of the secondary vacuum tube by comparing an audio signal input to the secondary vacuum tube and an output audio signal from the secondary vacuum tube, and determines the audio signal to amplify in the amplifier according to the calculated amplification ratio of the vacuum tube and the calculated amplification ratio of the secondary vacuum tube.

11. The sound output device of claim 10, further comprising:

a second switch circuit that selectively provides one of the output audio signal from the vacuum tube, the output audio signal from the secondary vacuum tube, and the received audio signal, to the amplifier, wherein, when the vacuum tube is operating normally, the controller controls the second switch circuit to provide the output audio signal from the vacuum tube to the amplifier, when the vacuum tube is not operating normally and the secondary vacuum tube is operating normally, the controller controls the second switch circuit to provide the output audio signal from the secondary vacuum tube to the amplifier, and when the vacuum tube is not operating normally and the secondary vacuum tube is not operating normally, the controller controls the second switch circuit to provide the received audio signal to the amplifier.

12. An audio apparatus comprising:
a communication interface that receives audio content;
an audio processor that processes the audio content into a plurality of audio signals;
at least one vacuum tube for selectively amplifying the plurality of audio signals;
a power supply that supplies power to the vacuum tube;
a first switch circuit that selectively connects the power supply to the vacuum tube; and
a controller that controls the first switch circuit according to whether the vacuum tube is used,
wherein the vacuum tube comprises:
a heater that emits electrons by heating a cathode; and
a plate that collects the electrons emitted from the cathode, and
the first switch circuit comprises:
a first switch that selectively connects the power supply to the plate; and
a second switch that selectively connects the power supply to the heater,
wherein the controller turns on the first switch and the second switch when the vacuum tube is used, and turns off at least one of the first switch and the second switch when the vacuum tube is not used.

13. An audio apparatus comprising:
a communication interface that receives audio content;
an audio processor that processes the audio content into a plurality of audio signals;
at least one vacuum tube for selectively amplifying the plurality of audio signals;
a power supply that supplies power to the vacuum tube;
a first switch circuit that selectively connects the power supply to the vacuum tube;
a controller that controls the first switch circuit according to whether the vacuum tube is used; and
an amplifier that selectively amplifies and outputs the audio signals from the audio processor or an amplified signal output from the at least one vacuum tube,
wherein the controller determines a signal to input to the amplifier according to whether the at least one vacuum tube is operating normally.

14. The audio apparatus of claim 13, further comprising:
a user interface that, when the vacuum tube is not operating normally, notifies a user of an abnormal operation of the vacuum tube.

15. The audio apparatus of claim 13, wherein the at least one vacuum tube comprises one vacuum tube, and
the controller determines whether the vacuum tube is operating normally according to an amplification ratio of the vacuum tube, controls to two-stage amplify the audio signals through the vacuum tube and the amplifier when the vacuum tube is operating normally, and controls to one-stage amplify the audio signals through the amplifier when the vacuum tube is not operating normally.

16. The audio apparatus of claim 13, further comprising:
a second switch circuit that selectively provides one of an output audio signal from the vacuum tube and the audio signals to the amplifier,
wherein, when the vacuum tube is operating normally, the controller controls the switch unit to provide the output audio signal from the vacuum tube to the amplifier, and
when the vacuum tube is not operating normally, the controller controls the switch unit to provide the audio signals to the amplifier.

17. A sound output method of a sound output device for selectively amplifying an input audio signal using at least one vacuum tube, the sound output method comprising:
inputting an audio signal;
selectively amplifying the input audio signal using the vacuum tube; and
determining whether the vacuum tube is operating normally,
wherein selectively amplifying the input audio signal comprises:
two-stage amplifying the audio signal by the vacuum tube and an amplifier when the vacuum tube is operating normally, and
one-stage amplifying the audio signal through the amplifier without inputting the audio signal to the vacuum tube when the vacuum tube is not operating normally.

18. The sound output method of claim 17, wherein the two-stage amplifying the audio signal comprises controlling the amplifier to amplify an output audio signal from the vacuum tube when the vacuum tube is operating normally and the one-stage amplifying the audio signal comprises controlling the amplifier to amplify the input audio signal when the vacuum tube is not operating normally.

19. A sound output device comprising:
a vacuum tube for amplifying an audio signal;
a power supply that supplies power to the vacuum tube;
a first switch circuit that selectively connects the power supply to the vacuum tube; and
a controller that controls the first switch circuit according to whether the vacuum tube is used, wherein the first switch circuit comprises:
a first switch that selectively connects the power supply to a plate of the vacuum tube; and
a second switch that selectively connects the power supply to a heater of the vacuum tube.

\* \* \* \* \*